US012568779B2

(12) United States Patent
Sugiura et al.

(10) Patent No.: US 12,568,779 B2
(45) Date of Patent: Mar. 3, 2026

(54) METHOD OF FORMING TREATED SILICON-CARBON MATERIAL

(71) Applicant: ASM IP Holding B.V., Almere (NL)

(72) Inventors: Hirotsugu Sugiura, Tama (JP); Yoshiyuki Kikuchi, Tokyo (JP)

(73) Assignee: ASM IP Holding B.V., Almere (NL)

( * ) Notice: Subject to any disclaimer, the term of this patent is extended or adjusted under 35 U.S.C. 154(b) by 405 days.

(21) Appl. No.: 18/227,016

(22) Filed: Jul. 27, 2023

(65) Prior Publication Data

US 2024/0047198 A1 Feb. 8, 2024

Related U.S. Application Data

(60) Provisional application No. 63/394,093, filed on Aug. 1, 2022.

(51) Int. Cl.

| | |
|---|---|
| ***H01L 21/02*** | (2006.01) |
| ***C23C 16/32*** | (2006.01) |
| ***C23C 16/505*** | (2006.01) |
| ***C23C 16/56*** | (2006.01) |
| ***H01J 37/32*** | (2006.01) |

(52) U.S. Cl.

CPC ...... *H01L 21/02323* (2013.01); *C23C 16/325* (2013.01); *C23C 16/505* (2013.01); *C23C 16/56* (2013.01); *H01J 37/32091* (2013.01); *H01J 37/32146* (2013.01); *H01J 37/3244* (2013.01); *H01L 21/02126* (2013.01); *H01L 21/02274* (2013.01); *H01L 21/0228* (2013.01); *H01L 21/0234* (2013.01); *H01J 2237/332* (2013.01); *H01L 21/02167* (2013.01)

(58) Field of Classification Search

None

See application file for complete search history.

(56) References Cited

U.S. PATENT DOCUMENTS

| | | | | |
|---|---|---|---|---|
| 10,483,099 | B1 | 11/2019 | Blanquart | |
| 11,482,412 | B2 | 10/2022 | Blanquart | |
| 2021/0035854 | A1 * | 2/2021 | Yoo | H01L 21/0234 |
| 2021/0238742 | A1 * | 8/2021 | Susa | C23C 16/515 |
| 2022/0178023 | A1 * | 6/2022 | Susa | C23C 16/45536 |
| 2022/0301823 | A1 | 9/2022 | Yoo | |
| 2023/0043629 | A1 | 2/2023 | Susa | |

* cited by examiner

*Primary Examiner* — Asok K Sarkar

(74) *Attorney, Agent, or Firm* — Snell & Wilmer L.L.P.

(57) ABSTRACT

Methods and systems of forming treated silicon-carbon material are disclosed. Exemplary methods include depositing silicon-carbon material onto a surface of the substrate and treating the silicon-carbon material. The step of treating can include a first treatment step followed by a second treatment step, wherein the first treatment step includes providing first reductant gas activated species and the second treatment step includes providing one or more of a first oxidant gas activated species and a second reductant gas activated species.

20 Claims, 8 Drawing Sheets

METHOD OF FORMING TREATED SILICON-CARBON MATERIAL

CROSS-REFERENCE TO RELATED APPLICATIONS

This application claims priority to U.S. Provisional Patent Application Ser. No. 63/394,093 filed Aug. 1, 2022 titled METHOD OF FORMING TREATED SILICON-CARBON MATERIALS, the disclosure of which is hereby incorporated by reference in its entirety.

FIELD OF INVENTION

The present disclosure generally relates to methods suitable for use in the manufacture of electronic devices. More particularly, examples of the disclosure relate to methods suitable for forming structures that include a silicon-carbon material layer, to structures including such layers, and to systems for performing the methods and/or forming the structures.

BACKGROUND OF THE DISCLOSURE

During the manufacture of devices, such as semiconductor devices, it is often desirable to fill features (e.g., trenches or vias) on the surface of a substrate with insulating or dielectric material. For example, silicon-carbon material can be used to fill gaps on a surface of a substrate.

While silicon-carbon material can be used to fill features on a surface of a substrate in some applications, typical silicon-carbon material can exhibit undesired variability in various properties, especially at higher temperatures. For example, silicon-carbon material can exhibit undesirable shrinkage and/or relatively high leakage current when the silicon-carbon is exposed to relatively high temperatures, such as temperatures used in the manufacture of electronic devices—e.g., temperatures used in front end of line processing. Attempts to mitigate shrinkage have often resulted in silicon-carbon material with increased leakage current. Similarly, attempts to reduce leakage current have resulted in silicon-carbon material that exhibits greater shrinkage. Further, attempts to reduce shrinkage may result in a loss of carbon in the silicon-carbon material.

Accordingly, improved methods for forming silicon-carbon material, which provide desired silicon-carbon material properties and/or composition, are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming treated silicon-carbon material suitable for use in the formation of electronic devices. While the ways in which various embodiments of the present disclosure address drawbacks of prior methods and structures are discussed in more detail below, in general, exemplary embodiments of the disclosure provide improved methods that include a two-step treatment process that can be used during or after deposition of silicon-carbon material. The two-step treatment provides treated silicon-carbon material with desired properties, such as reduced shrinkage, reduced current leakage, and desired carbon content. The methods described herein can be used to fill features on a surface of a substrate.

In accordance with various embodiments of the disclosure, methods of forming treated silicon-carbon material are provided. Exemplary methods include providing a substrate within a reaction chamber of a reactor, depositing silicon-carbon material onto a surface of the substrate, and after the step of depositing, treating the silicon-carbon material. Exemplary steps of treating the silicon-carbon material include a first treatment step followed by a second treatment step. The first treatment step can include providing a first reductant gas activated species. The second treatment step can include providing one or more of a first oxidant gas activated species and a second reductant gas activated species. In some cases, the first treatment step further includes providing a second oxidant gas activated species. In some cases, the second treatment step includes providing the second reductant gas activated species. For example, in some cases, the second treatment step can include providing the first oxidant gas activated species and the second reductant gas activated species. In some cases, the first reductant gas activated species and the second reductant gas activated species can be formed using the same reductant gas. The steps of depositing silicon-carbon material and treating the silicon-carbon material can be repeated one or more times—e.g., to fill a gap on the substrate surface. The first and/or second reductant gas can each independently include, for example, a gas selected from the group consisting of Ar, He, $NH_3$, $N_2$ and Hz, and any combination thereof. The first oxidant can be or include, for example, a gas selected from the group consisting of CO, $CO_2$, $H_2O$, and a C1-C22 alcohol. For reasons set forth in more detail below, in accordance with examples of the disclosure, the step of providing the first oxidant gas activated species does not comprise providing oxygen ($O_2$) to the reaction chamber. Exemplary methods or steps thereof can be performed using a variety of reactor systems, such as a capacitively coupled plasma (CCP) apparatus, a surface wave plasma (SWP) apparatus, an inductively coupled plasma (ICP) apparatus, or an electron cyclotron resonance (ECR) apparatus.

In accordance with yet further exemplary embodiments of the disclosure, a structure is formed using a method as described herein.

In accordance with yet further exemplary embodiments of the disclosure, a system is provided for performing a method and/or for forming a structure as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
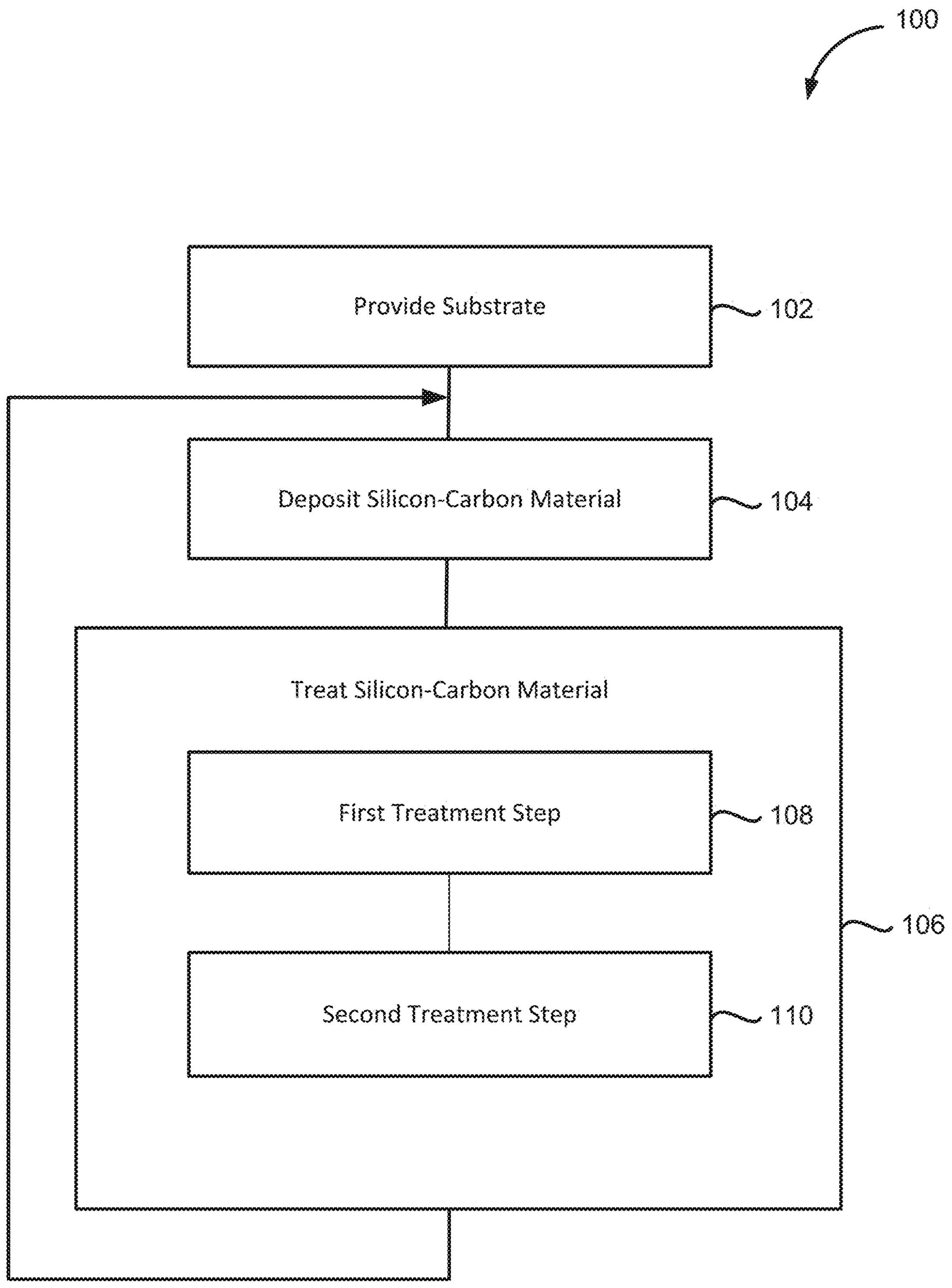
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming treated silicon-carbon material. By way of examples, methods described herein can be used to treat deposited silicon-carbon material—e.g., silicon-carbon material deposited in gaps (e.g., trenches, vias, or spaces between protrusions) on a surface of a substrate. The deposited silicon-carbon material can be initially flowable and flow within the gaps to fill the gaps. The initially-flowable material can then harden—e.g., as part of the deposition process. As set forth in more detail below, the deposited or hardened silicon-carbon material can be treated to obtain desired properties, such as increased resistance to leakage current, increased resistance to shrinkage—even at elevated temperatures, and/or silicon-carbon material with a desired carbon content.

Exemplary methods described herein can be used to form structures that can be used in a variety of applications, such as the formation of electronic devices. For example, the methods can be used to form treated silicon-carbon material suitable for use in front end of line applications. Additionally or alternatively, exemplary methods can be used to form treated silicon-carbon material suitable for cell isolation in 3D cross point memory devices, self-aligned vias, dummy gates, reverse tone patterns, PC RAM isolation, cut hard masks, DRAM storage node contact (SNC) isolation, and the like.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a noble gas. In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than a precursor, that activates a precursor, modifies a precursor, or catalyzes a reaction of a precursor; a reactant may, in some cases, provide an element (such as H) to a film matrix and become a part of the film matrix when, for example, power (e.g., radio frequency (RF) power) is applied. In some cases, the terms precursor and reactant can be used interchangeably. The term "inert gas" refers to a gas that does not take part in a chemical reaction to an appreciable extent and/or a gas that excites a precursor (e.g., to facilitate polymerization of the precursor) when, for example, power (e.g., RF power) is applied to form a plasma; an inert gas may not become a part of a film matrix to an appreciable extent. When excited (e.g., via a plasma), an inert gas, including, for example, one or more noble gases, can be considered a reactant.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as gaps (e.g., recesses or vias), lines or protrusions, such as lines having gaps formed therebetween, and the like formed on or within or on at least a portion of a layer or bulk material of the substrate. By way of examples, one or more features (e.g., recesses) can have a width of about 10 nm to about 100 nm, a depth or height of about 30 nm to about 1,000 nm, and/or an aspect ratio of about 3.0 to 100.0.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not. Further, a single film or layer can be formed using multiple deposition cycles and/or multiple deposition and treatment cycles.

As used herein, the term "silicon-carbon material" can refer to a layer whose chemical formula can be represented as including silicon and carbon. Layers comprising silicon-carbon material can include other elements, such as one or more of oxygen, nitrogen and hydrogen.

As used herein, the term "structure" can refer to a partially or completely fabricated device structure. By way of examples, a structure can be a substrate or include a substrate with one or more layers and/or features formed thereon.

As used herein, the term "cyclic deposition process" can refer to a vapor deposition process in which deposition cycles, typically a plurality of consecutive deposition cycles, are conducted in a process chamber. Cyclic deposition processes can include cyclic chemical vapor deposition (CVD) and atomic layer deposition processes. A plasma cyclic deposition process can include one or more cycles that include plasma activation of a precursor, a reactant, and/or an inert gas. Generally, each deposition cycle of a cyclic deposition process can include one or more of (1) pulsing a precursor to the reaction chamber, (2) pulsing a reactant to the reaction chamber, or (3) pulsing a plasma power or other activation source. In some cases, the cyclic deposition process can include two or all three of such steps.

In this disclosure, "continuously" or "continuous" can refer to without breaking a vacuum, without interruption as a timeline, without any material intervening step, without changing treatment conditions, immediately thereafter, as a next step, or without an intervening discrete physical or chemical structure between two structures other than the two structures in some embodiments and depending on the context.

A flowability (e.g., an initial flowability) can be determined as follows:

TABLE 1

| bottom/top ratio (B/T) | Flowability |
|---|---|
| 0 < B/T < 1 | None |
| 1 ≤ B/T < 1.5 | Poor |
| 1.5 ≤ B/T < 2.5 | Good |
| 2.5 ≤ B/T < 3.5 | Very good |
| 3.5 ≤ B/T | Extremely good |

where B/T refers to a ratio of thickness of film deposited at a bottom of a recess to thickness of film deposited on a top surface where the recess is formed, before the recess is filled. Typically, the flowability is evaluated using a wide recess having an aspect ratio of about 1 or less, since generally, the higher the aspect ratio of the recess, the higher the B/T ratio becomes. The B/T ratio generally becomes higher when the aspect ratio of the recess is higher. As used herein, a "flowable" film or material exhibits good or better flowability.

Flowability of film can be temporarily obtained when a volatile silicon-carbon precursor, for example, is polymerized by activated species—e.g., formed using a plasma. The flowable material can deposit on a surface of a substrate when the gaseous precursor is activated or fragmented by energy provided by activated species, so as to initiate polymerization. The resultant polymer material can exhibit temporarily flowable behavior. When a deposition step is complete and/or after a short period of time (e.g., about 3.0 seconds), the film may no longer be flowable, but rather becomes solidified or hardened, and thus, a separate solidification process may not be employed.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 in accordance with examples of the disclosure. Method 100 can be used to form treated silicon-carbon material on a surface of a substrate. In some cases, method 100 can be used to fill one or more patterned recesses (also referred to herein as gaps) on a surface of a substrate. Method 100 can be or include a cyclic process, such as a cyclical plasma enhanced chemical vapor deposition (PECVD) process or plasma enhanced atomic layer deposition (PEALD) process or a combination of PECVD and PEALD processes. Method 100 can be used to form silicon-carbon material having desired properties, such as relatively low leakage current and desired thermal stability.

As illustrated, method 100 includes the steps of providing a substrate within a reaction chamber of a reactor (step 102), depositing silicon-carbon material onto a surface of the substrate (step 104), and after the step of depositing, treating the silicon-carbon material using a two-step process (step 106).

During step 102, a substrate is provided into a reaction chamber of a gas-phase reactor. The substrate can include any substrate noted herein. The substrate may have one or more gaps on the surface of the substrate.

In accordance with examples of the disclosure, the reaction chamber can form part of a cyclical deposition reactor, such as an atomic layer deposition (ALD) (e.g., PEALD) reactor or chemical vapor deposition (CVD) (e.g., PECVD) reactor. Various steps of methods described herein can be performed within a single reaction chamber or can be performed in multiple reaction chambers, such as reaction chambers of a cluster tool.

During step 102, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be less than or equal to 400° C. or less than or equal to 100° C. (e.g., about 23° C. to about 100° C.). A pressure within the reaction chamber can be from, for example, about 200 Pa to about 1,250 Pa.

During step 104, a reactant and a precursor can be provided within the reaction chamber to deposit silicon-carbon material onto a surface of the substrate. The reactant can include a gas comprising one or more gases, such as one or more of argon (Ar), helium (He), ammonia ($NH_3$), nitrogen ($N_2$), and hydrogen ($H_2$), separately or any mixture thereof. By way of particular examples, the reactant is or includes hydrogen, argon and/or helium. A mixture of the argon and helium can include, for example, from about 0 to about 50 vol. % argon and/or helium.

Exemplary silicon-carbon precursors suitable for use during step 104 can be represented by the formula $Si_aC_bH_cO_dN_e$, where a is a natural number no less than 1 and no greater than 5, b is a natural number no less than 1 and no greater than 20, c is a natural number no less than 1 and no greater than 40, d is 0 or a natural number no greater than 10, and e is 0 or a natural number no greater than 5. The silicon-carbon precursor can include a chain or cyclic molecule having one or more carbon atoms, one or more silicon atoms, and one or more hydrogen atoms, such as molecules represented by the formula above. By way of particular examples, the precursor can be or include one or more cyclic (e.g., aromatic) structures and/or compounds having at least one double bond.

In accordance with some examples of the disclosure, a chemical formula of the silicon-carbon precursor can be represented by the formula:

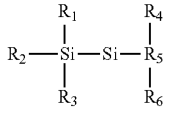

where $R_1$-$R_6$ are independently selected from (C1-C10) alkyl, alkene, or aryl groups and H. By way of particular example, each of $R_1$-$R_6$ can include a methyl group as illustrated by the following chemical formula.

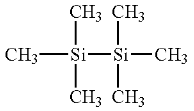

In accordance with other examples of the disclosure, a chemical formula of the silicon-carbon precursor can be represented by the formula:

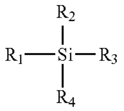

where $R_1$-$R_4$ are independently selected from (e.g., C1-C10) alkyl, alkene, or aryl groups and H. For example, the chemical formula can be represented by the formula:

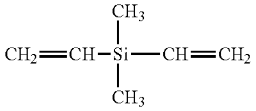

A flowrate of the silicon-carbon precursor from a silicon-carbon precursor source to the reaction chamber can vary according to other process conditions. By way of examples, the flowrate can be from about 100 sccm to about 3,000 sccm. Similarly, a duration of each step of providing a silicon-carbon precursor to the reaction chamber can vary, depending on various considerations. By way of examples, the duration can range from about 1.0 second to about 35.0 seconds.

During step 104, a flow of the silicon-carbon precursor to the reaction space can be decreased or ceased. Upon decreasing or ceasing the precursor flow, a concentration of the silicon-carbon precursor within the reaction space can decrease.

During step 104, a plasma can be formed. The plasma can be a direct plasma. A power used to ignite and maintain the plasma can range from about 50 W to about 800 W. A frequency of the power can range from about 0.4 MHz to about 27.12 MHz. A duration of application of the plasma power (e.g., for each deposition cycle) can be between about 0.1 and about 60 seconds. In some cases, the plasma power may be provided after ceasing or decreasing the flow of the precursor to the reaction chamber.

During step 104, the silicon-carbon precursor is converted into the initially viscous material using excited species. The initially viscous silicon-carbon material can flow into the at least one recess or gap and can become deposited silicon-carbon material. The deposited silicon-carbon material can become solid or substantially solid.

Treatment step 106 can be used to tune desired properties and to form the treated silicon-carbon material. As illustrated, step 106 can include a first treatment step 108 and (e.g., followed by) a second treatment step 110.

During first treatment step 108, a first reductant gas activated species is provided. The first reductant gas activated species can be formed by providing a first reductant gas within the reaction chamber and forming a plasma. Step 108 can include, for example, providing a first reductant gas selected from the group consisting of Ar, He, $NH_3$, $N_2$ and $H_2$, and any combination thereof and forming a direct, indirect, or remote plasma using the first reductant gas to form the first reductant gas activated species. A flowrate of the first reductant gas can be between about 10 and about 2000 sccm. A duration of step 108 (e.g., for each deposition cycle) can be between about 1 and about 30 seconds or between about 30 and about 90 seconds. If performed after multiple deposition cycles, a duration of step 108 can be between about 1 and about 30 seconds or between about 30 and about 600 seconds. In some cases, reductant gas is referred to simply as reductant.

A power used to form the plasma during step 108 can be less than or equal to 2000 W or between about 400 W and about 600 W; a frequency of the power can range from about 100 kHz and no greater than 60 MHz. In some cases, the plasma power during step 108 and/or during step 110, described below, can be pulsed—e.g., at a frequency between about 100 Hz and about 100 kHz and/or with a duty cycle between about 10% and about 80%. Additionally or alternatively, a plasma power provided during one or more of steps 108 and 110 can include a first frequency and a second frequency different from the first frequency. The first frequency can be no less than 15.56 MHz and no more than 60 MHz and/or the second frequency can be no less than 100 kHz and no more than 13.56 MHz.

A temperature within a reaction chamber during step 108 can be less than 400° C. or between about 50° C. and about 100° C. A pressure within a reaction chamber during step 108 can be from about 300 Pa to 2,000 Pa.

Step 108 can be performed in the same reaction chamber as steps 102 and/or 104 or can be a separate reaction chamber, such as another reaction chamber of the same cluster tool.

In some cases, step 108 can further include providing a second oxidant gas activated species. In these cases, the second oxidant gas activated species may be formed by forming a plasma. The second oxidant gas activated species can be formed as described below, i.e., using the same oxidant gas(es) and plasma power as described below in connection with the first oxidant gas activated species that can be formed during step 110. In some cases, the second oxidant does not comprise molecular oxygen ($O_2$).

By way of particular example, step 108 can include providing hydrogen or a mixture of hydrogen and carbon dioxide within the reaction chamber, and forming activated species from such gas.

During step 110, one or more of a first oxidant gas activated species and a second reductant gas activated species are provided—e.g., to the reaction chamber. The first oxidant gas activated species can be formed by providing a first oxidant gas within the reaction chamber and forming a plasma. Step 110 can include, for example, providing a first oxidant gas selected from the group consisting of CO, $CO_2$, $H_2O$, and a C1-C22 alcohol, and any combination thereof and forming a direct, indirect, or remote plasma using the first oxidant gas to form the first oxidant gas activated species. A flowrate of the first oxidant gas to the reaction chamber can be between about 10 and about 2000 sccm. In some cases, the first oxidant gas does not include molecular oxygen ($O_2$). In some cases, oxidant gas is referred to simply as oxidant.

The second reductant gas activated species can be formed by providing a second reductant gas within the reaction chamber and forming a plasma. In these cases, step 110 can include, for example, providing a second reductant gas selected from the group consisting of Ar, He, $NH_3$, $N_2$ and Hz, and any combination thereof and forming a direct, indirect, or remote plasma using the second reductant gas to form the second reductant gas activated species. The first reductant gas activated species and the second reductant gas activated species can be formed using the same or different reductant gas.

A flowrate of the second reductant can be as described above in connection with the first reductant gas. A duration of step 110 (e.g., for each deposition cycle) can be between about 1 and about 30 seconds or between about 30 and about 90 seconds. A plasma power and duration, a temperature, and a pressure during step 110 can be the same or similar to the plasma power and duration, a temperature, and a pressure described above in connection with step 108.

By way of particular examples, step 110 can include providing hydrogen or a combination of hydrogen and carbon dioxide to the reaction chamber and forming activated species from such gas.

Although not separately illustrated in FIG. 1, method 100 can include one or more purge steps. For example, method 100 can include a step of purging after the first treatment step and before the second treatment step. Additionally or alternatively, method 100 can include a step of purging after step 102 and/or after step 104. The purge may be effected by providing a vacuum pressure within the reaction chamber and/or by providing an inert gas to the reaction chamber.

As illustrated, method 100 can include a repeat loop that includes steps 104 and 106. Alternatively, in some cases, a single treatment step can be performed after step 104.

Figure 2:
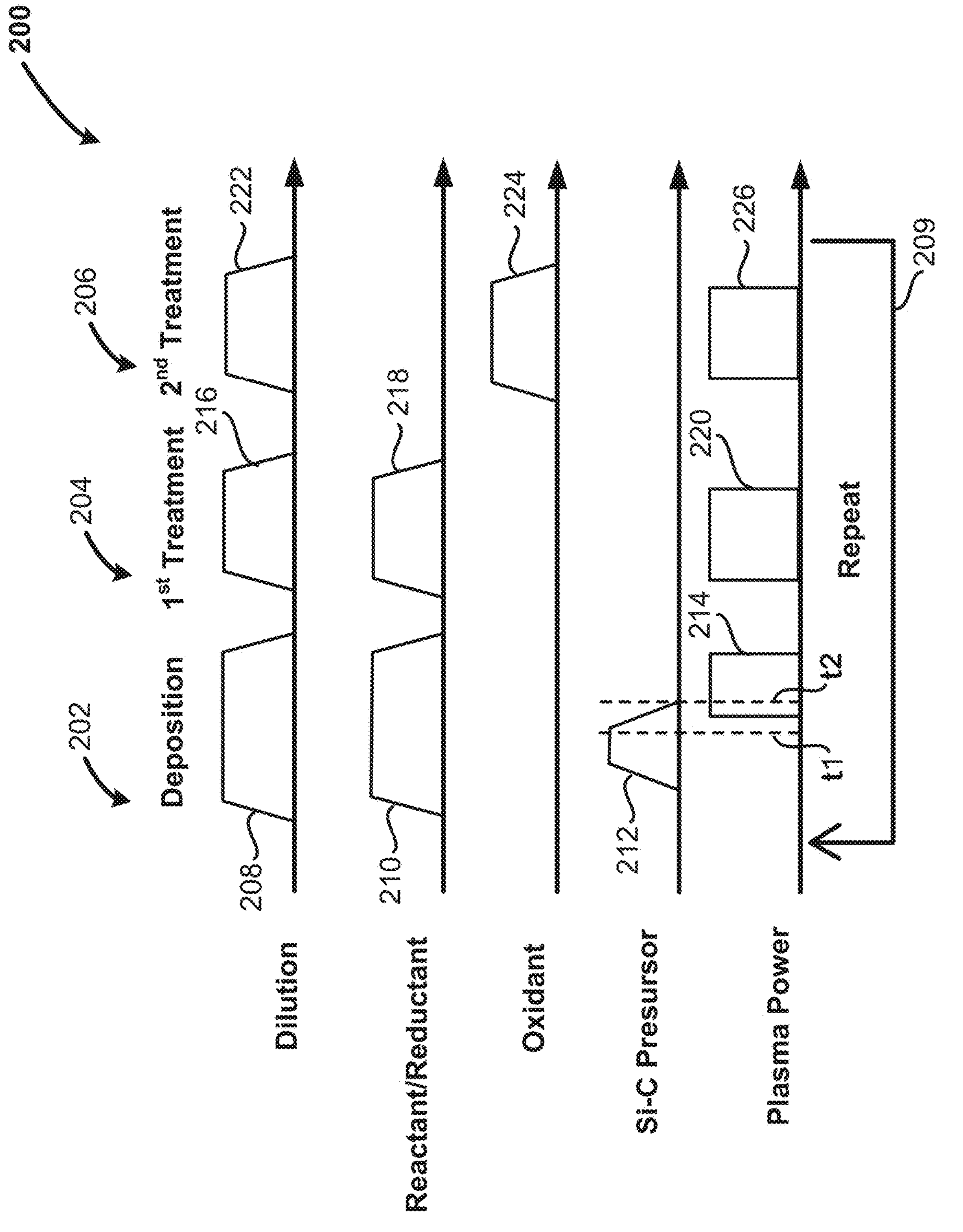
FIG. 2 illustrates a timing sequence in accordance with exemplary embodiments of the disclosure.
Figure 3:
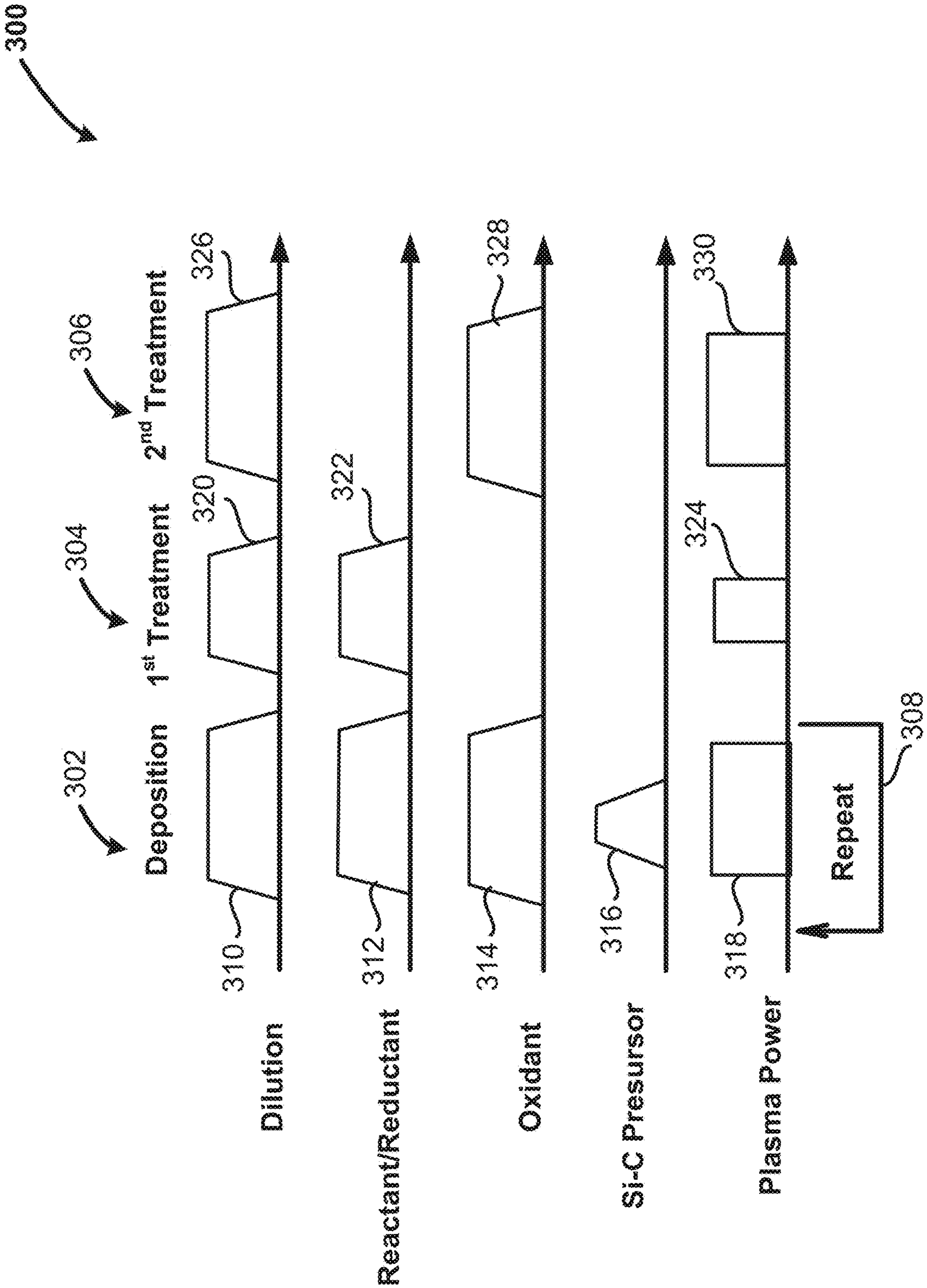
FIG. 3 illustrates another timing sequence in accordance with exemplary embodiments of the disclosure.

FIGS. 2 and 3 illustrate examples of pulse timing sequences for methods in accordance with exemplary embodiments of the disclosure. For example, timing sequences illustrated in FIGS. 2 and 3 can be used in connection with method 100.

The timing sequences illustrated in FIGS. 2 and 3 schematically illustrate two exemplary sequences. Other sequences are also within the scope of this disclosure. In the illustrations, a width of the pulses may not necessarily be indicative of an amount of time associated with each pulse; the illustrated pulses can illustrate relative start times and/or end times of the various pulses. Similarly, a height may not necessarily be indicative of a specific amplitude or value, but can show relatively high and low values. Process conditions for each pulse period can be as described above in connection with corresponding steps of method 100. The illustrated examples are merely illustrative and are not meant to limit the scope of the disclosure or claims.

Timing sequence 200 includes a deposition step 202, a first treatment step 204, and a second treatment step 206, which form part of a deposition cycle 209. Deposition cycle 209 can be repeated for, for example, about 0 or 1 to about 50 times.

Deposition step 202 can be the same or similar to step 104 described above. As illustrated, during deposition step 202, a reactant (e.g., a reductant gas, such as a reductant gas described herein) and optionally a dilution gas (e.g., an inert gas) are provided to a reaction chamber for a dilution gas pulse period 208 and a reactant pulse period 210, respectively. Pulse period 208 and/or 210 can range from about 5.0 to about 100.0 seconds and can be the same or different and/or can vary from deposition cycle to deposition cycle. Further, as illustrated, pulse periods 208 and 210 can be of substantially the same duration (e.g., within about 10 or 5 percent) and can overlap in time and in space.

After pulse periods 208 and 210 are initiated, a silicon-carbon precursor is provided to the reaction chamber for a pulse period 212. Pulse period 212 can range from, for example, about 1.0 seconds to about 35.0 seconds. Each pulse period 212 can be the same or vary in time. As illustrated, pulse period 212 can overlap with pulse periods 208 and 210. For example, pulse period 212 can start after pulse periods 208 and 210 start and can end prior to pulse period 208 and 210 ending.

After the flow of the silicon-carbon precursor to the reaction chamber has ceased at t1, power to form a plasma can be provided for a pulse period 214. A power (e.g., applied to electrodes and/or power frequency) during pulse period 214 can be as noted above in connection with step 104.

Pulse period 212 can end at t2, wherein most or substantially all, e.g., 90 percent or more, of the silicon-carbon precursor present at t1 is removed from the reaction space. Pulse period 214 can begin prior to t2 and after t2. Thus, in the illustrated example, the dilution gas, the reactant gas, and the silicon-carbon precursor are within the reaction chamber when the plasma is ignited/formed at the beginning of pulse period 214. Pulse period 214 can range from, for example, about 1.0 second to about 30.0 seconds. Each pulse period 208 can be the same or vary in time.

Once the flow of the silicon-carbon precursor to the reaction chamber has ceased at t1, the silicon-carbon precursor can begin to be purged from reaction space for a purge period or purge pulse using the dilution and/or reactant gas. The purge can be further assisted by way of a vacuum pump and can continue after pulse 212 and/or 214. The purge period can range from, for example, about 5.0 seconds to about 30.0 seconds. Each purge period can be the same or vary in time.

First treatment step 204 can be the same or similar to step 108 described above. In the illustrated example, both the dilution gas and the reductant gas are provided to the reaction chamber. The dilution gas can be provided for a first treatment dilution pulse period 216, the reductant can be provided for a first treatment reductant pulse period 218, and power can be applied for a first treatment pulse period 220. As illustrated, pulse periods 216 and 218 can overlap and can both begin before pulse period 220 and end after pulse period 220. The conditions (e.g., gas flowrates, power levels, pressure, temperatures, and the like) for step 204 can be as described above in connection with step 108.

Second treatment step 206 can be the same or similar to step 110 described above. In the illustrated example, both the dilution gas and an oxidant gas are provided to the reaction chamber. The dilution gas can be provided for a second treatment dilution pulse period 222, the oxidant gas can be provided for a second treatment oxidant pulse period 223, and power can be applied for a second treatment pulse period 226. As illustrated, pulse periods 222 and 224 can overlap and can both begin before pulse period 226 and end after pulse period 226. The conditions (e.g., gas flowrates, power levels, pressure, temperatures, and the like) for step 206 can be as described above in connection with step 110.

FIG. 3 illustrates another timing sequence that includes a deposition step 302, a first treatment step 304, and a second treatment step 306. In the illustrated example, deposition step 302 can be repeated a number of times (loop 308) prior to first treatment step 304 and second treatment step 306.

Step 302 can be the same or similar to step 104 described above. As illustrated, during deposition step 302, a reactant (e.g., a reductant gas, such as a reductant gas described herein), an oxidant (e.g., an oxidant as described herein) and optionally a dilution gas (e.g., an inert gas) are provided to a reaction chamber for a dilution gas pulse period 310, a deposition reactant pulse period 312, and a deposition oxidant pulse period 314, respectively. Pulse periods 310 and 312 can be the same or similar to pulse periods 208, 210, described above. Pulse period 314 can include providing an oxidant at a flowrate of, for example, about 100 to about 1000 sccm. A duration of pulse period 314 can be the same or similar to a duration of pulse period 208, 210, described above.

After pulse periods 310-314 are initiated, a silicon-carbon precursor is provided to the reaction chamber for a pulse period 316. Pulse period 316 can be the same or similar to pulse period 212, described above. Each pulse period 316 can be the same or vary in time. As illustrated, pulse period 316 can overlap with pulse periods 310-314. For example, pulse period 316 can start after pulse periods 310-314 start and can end prior to pulse periods 310-314 ending.

First treatment step 304 can be the same or similar to step 108 and/or step 204 described above. In the illustrated example, the dilution gas can be provided for a first treatment dilution pulse period 320, the reductant can be provided for a first treatment reductant pulse period 322, and power can be applied for a first treatment power pulse period 324. As illustrated, pulse periods 320 and 322 can overlap and can both begin before pulse period 324 and end after pulse period 324. The conditions (e.g., gas flowrates, power levels, pressure, temperatures, and the like) for step 304 can be as described above in connection with step 108.

Second treatment step 306 can be the same or similar to step 110 and/or step 206 described above. In the illustrated example, both the dilution gas and an oxidant gas are provided to the reaction chamber during step 306. The dilution gas can be provided for a second treatment dilution pulse period 326, the oxidant gas can be provided for a second treatment oxidant pulse period 328, and power can be applied for a second treatment power pulse period 330. As illustrated, pulse periods 326 and 328 can overlap and can both begin before pulse period 330 and end after pulse period 330. The conditions (e.g., gas flowrates, power levels, pressure, temperatures, and the like) for step 306 can be as described above in connection with step 110.

Although first treatment step 204 is illustrated with only a reductant and second treatment, steps 206 and 306 are illustrated with only an oxidant; other treatment gases, including, for example, mixtures of oxidants and reductants, can be used in accordance with timing sequence 200 or 300. For example, an oxidant can be provided during step 204 or 304 and/or a reductant can be provided during step 206 or 306.

Figure 4:
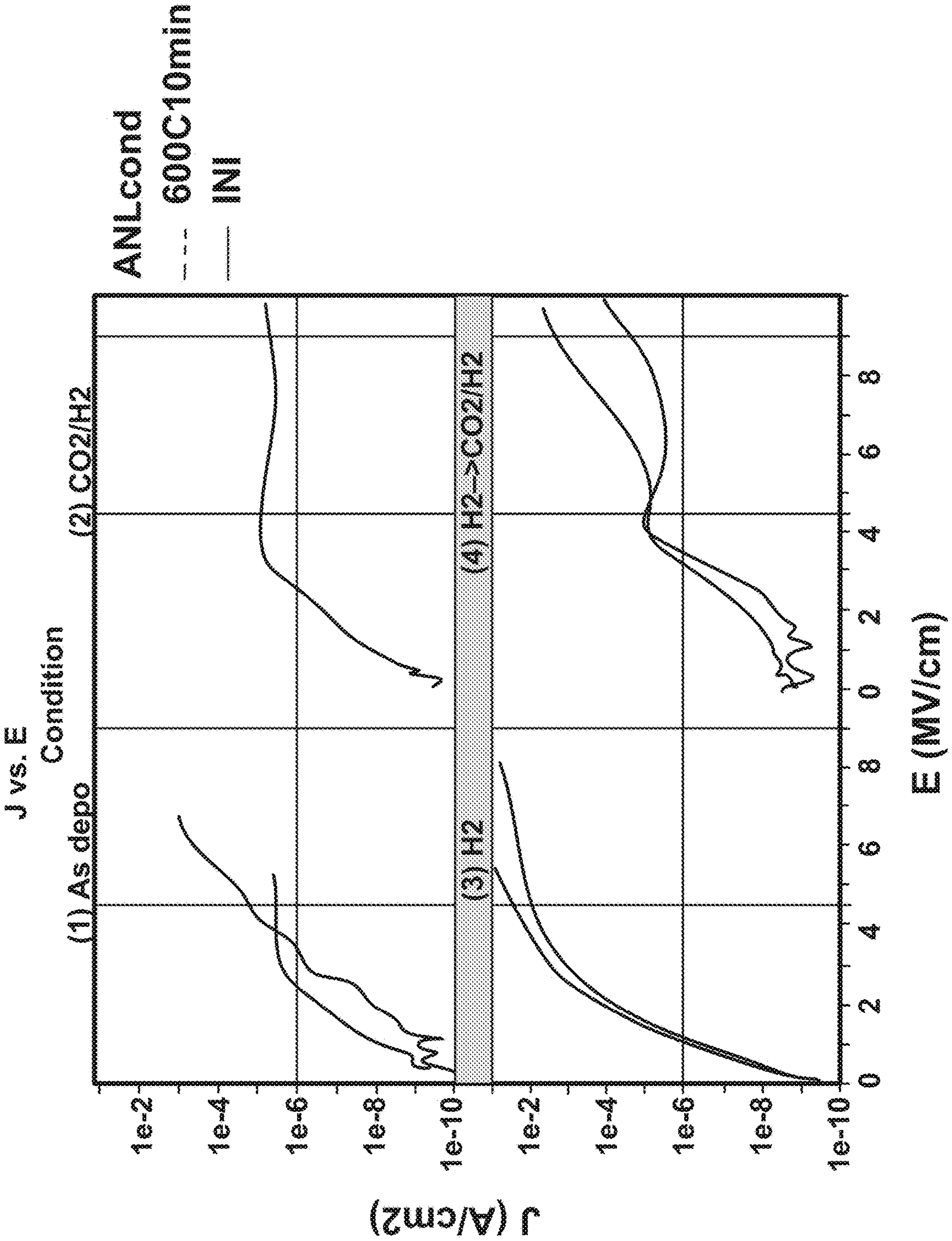
FIG. 4 illustrates leakage current versus electric field for various conditions.

FIG. 4 illustrates leakage current for silicon-carbon material for (1) as-deposited silicon-carbon material, (2) silicon-carbon material treated with a single treatment step using an oxidant and a reductant, (3) silicon-carbon material treated with a reductant, and (4) silicon-carbon material treated with a first treatment step and a second treatment step (e.g., using a reductant and an oxidant) as described herein—e.g., using timing sequence 200. The as-deposited silicon-carbon material exhibited undesirable shrinkage in an environment at 600° C. for 10 min. The silicon-carbon material treated with a single treatment step using an oxidant and a reductant exhibited acceptable leakage, but bubbling occurred after an annealing step. Silicon-carbon material treated with a reductant ($H_2$) exhibited acceptable shrinkage (in an environment at 600° C. for 10 min), but leakage current degraded. Silicon-carbon material treated with a first treatment step and a second treatment step as described herein exhibited good (low) shrinkage and good (low) leakage current. Table 2 below provides exemplary values for shrinkage, breakdown voltage (Vbd), composition, and density for silicon-carbon material deposited and treated as described herein.

TABLE 2

| Condition | Shrinkage @600 C. 10 min | Vbd @1e−3 A/cm$^2$ @600 C. 10 min | Bubbling after anneal @600 C. 10 min | Si/O/C/H @As depo | Density @As depo |
|---|---|---|---|---|---|
| DEPO only | 29.8 | 7 | None | 10/10/35/45 | 1.0 |
| DEPO + H2 TRT | 0 | 3 | None | 13/20/36/31 | 1.68 |
| DEPO + $H_2$/$CO_2$ TRT | 8.4 | — | Yes | 27/61/4/8 | 1.83 |
| DEPO + $H_2$ TRT → $H_2$/$CO_2$ TRT | 1.8 | 8 | None | 28/60/4/8 | 1.84 |

Figure 5:
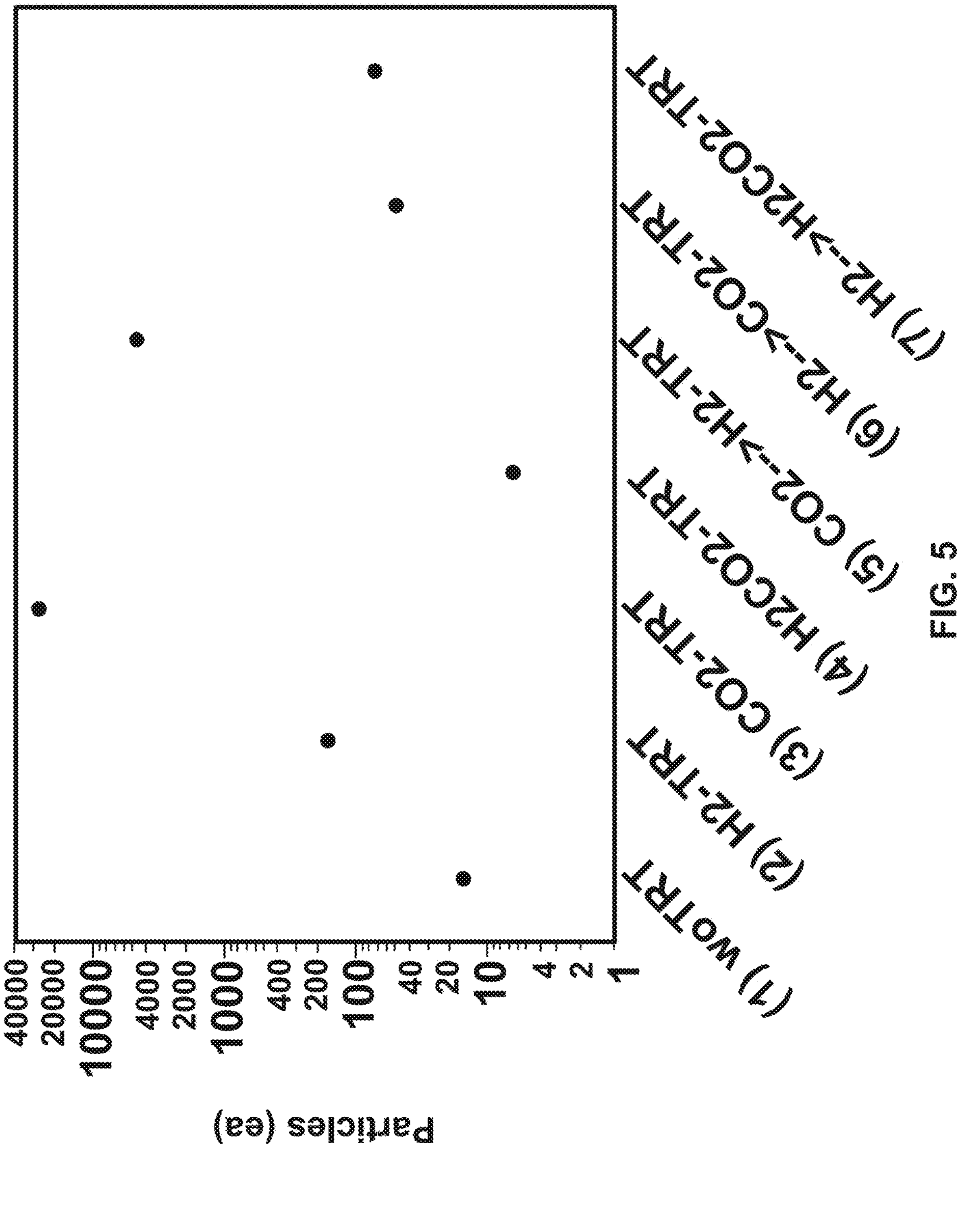
FIG. 5 illustrates particle counts on substrates processed under various conditions.

FIG. 5 illustrates particle measurements for various conditions, including (1) as-deposited silicon-carbon material, (2) silicon-carbon material treated with a single treatment step using a reductant, (3) silicon-carbon material treated with an oxidant, (4) silicon-carbon material treated with a single treatment step using a reductant and an oxidant, (5) silicon-carbon material treated with a first treatment step using an oxidant and a second treatment step using a reductant, (6) silicon-carbon material treated with a first treatment step using an reductant and a second treatment step using a oxidant, and (7) silicon-carbon material treated with a first treatment step using an reductant and a second treatment step using a reductant and an oxidant. As illustrated, treated silicon-carbon material formed using a two-step treatment process in which the first treatment step included a reductant and the second treatment step included an oxidant exhibited fewer particles. This is thought to result because as-deposited silicon-carbon material is very reactive and can react with oxidant to generated a relatively high number of particles. Use of a reductant during the first treatment step can reduce reactivity of the as-deposited silicon-carbon material due to enhanced cross linking and can thus reduce a number of particles that form on the surface. Conditions (6) and (7) can be formed using timing sequence 200, described above.

Figure 6:
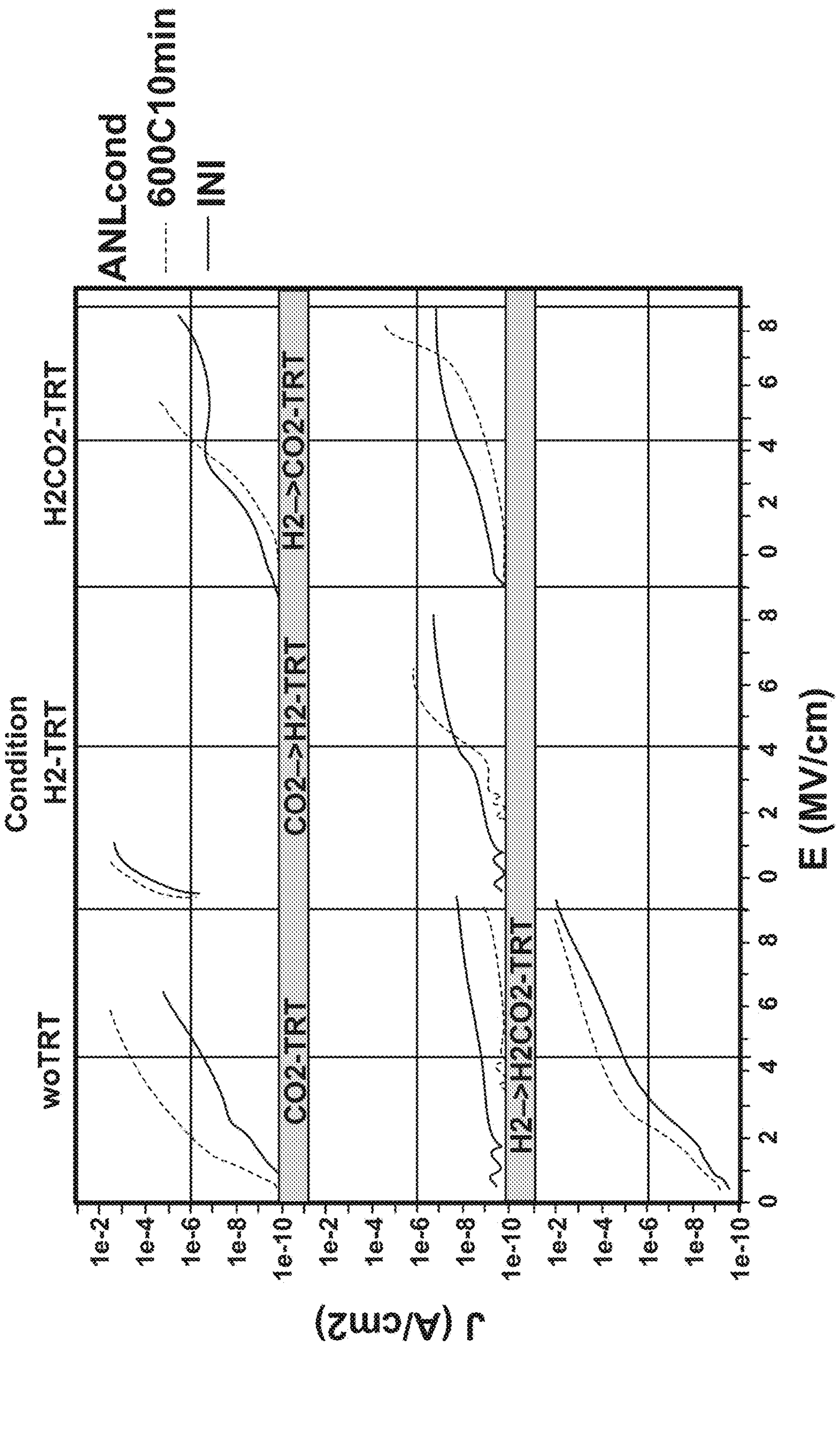
FIG. 6 illustrates leakage current versus electric field for various additional conditions.

FIG. 6 illustrates additional leakage current measurements for conditions (1)-(7) described above. As illustrated, use of an oxidant plasma treatment can improve (reduce)

leakage current. FIG. 6 again implies that the first treatment step may desirably include use of a reductant and the second treatment step may desirably include an oxidant. Use of the reductant treatment step is thought to generate a carbon-related conducing path. Use of an oxidant treatment step is thought to reduce the carbon and related dangling bonds due to high reactivity of oxygen with silicon in the precursor.

Figure 7:
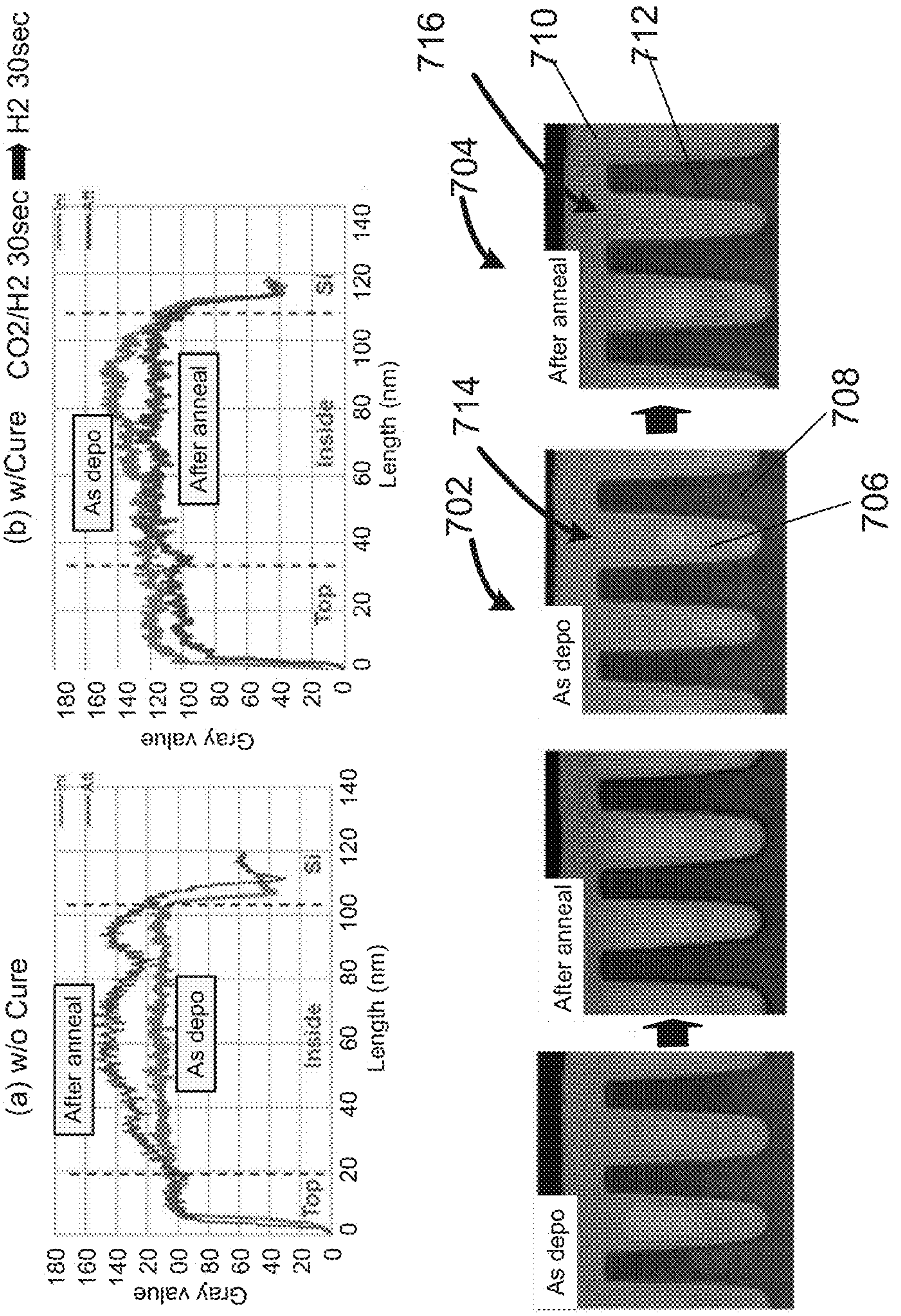
FIG. 7 illustrates scanning transmission electron microscopy images of structures and grey-scale values of deposited silicon-carbon material for various conditions.

FIG. 7 illustrates that treated silicon-carbon material formed in accordance with the disclosure (e.g., sequence 300) reduced discoloration in the treated silicon-carbon material (FIG. 7(*b*), compared to untreated silicon-carbon material (FIG. 7(*a*)). FIG. 7(*b*) illustrates structures 702 and 704 in accordance with the disclosure, which respectively include a substrate 708, 712, and treated silicon-carbon material 706 or annealed and treated silicon-carbon material 710 within gaps 714, 716. It is thought that the two-step treatment method described herein can reduce discoloration by using a reductant treatment step first to generate a path for oxygen atoms to diffuse during the first or second treatment step.

Figure 8:
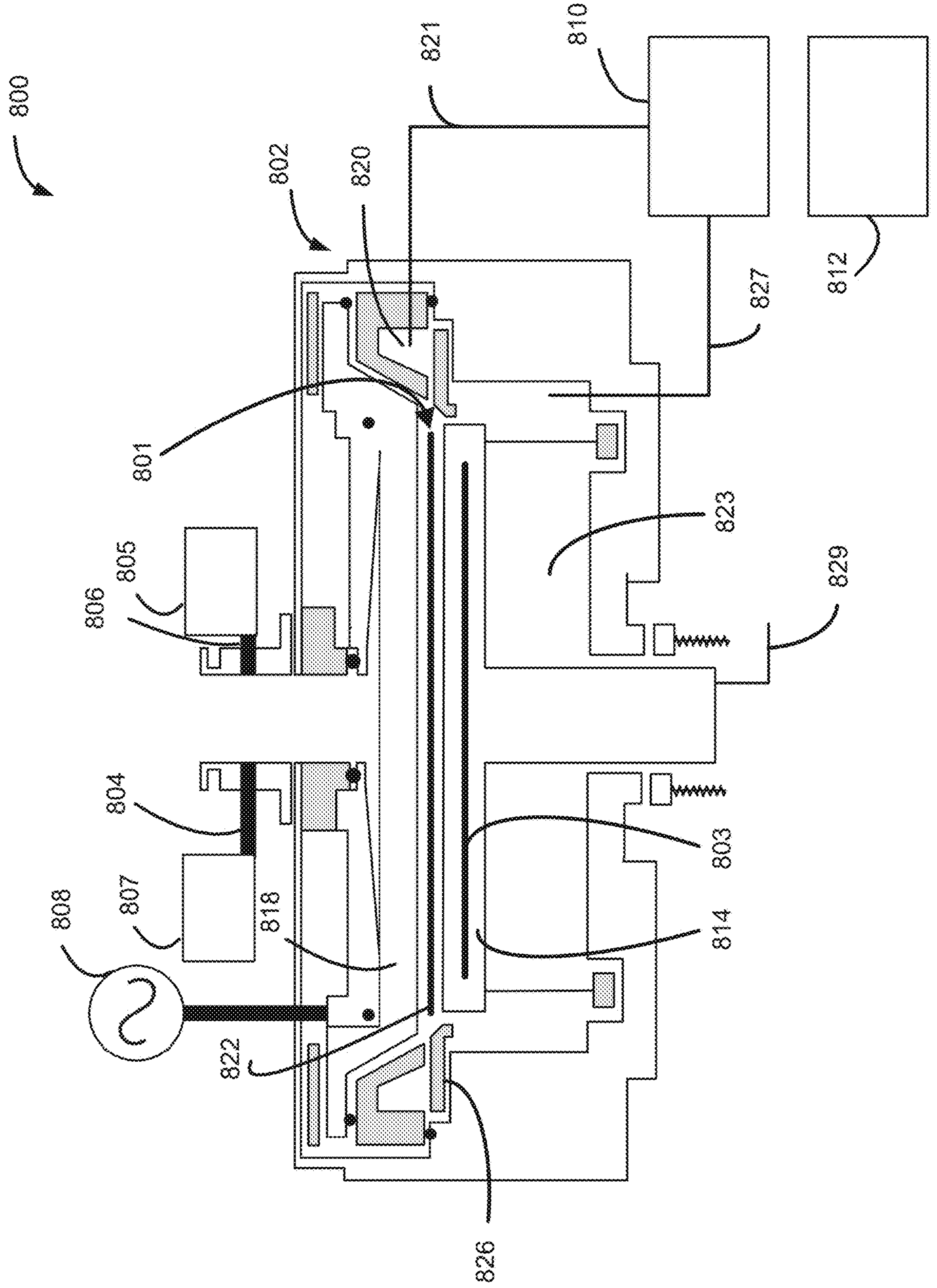
FIG. 8 illustrates a reactor system in accordance with exemplary embodiments of the disclosure.

Turning now to FIG. 8, a reactor system 800 in accordance with exemplary embodiments of the disclosure is illustrated. Reactor system 800 can be used to perform one or more steps or substeps as described herein and/or to form one or more structures or portions thereof as described herein. Reactor system 800 is illustrated as a capacitively coupled plasma (CCP) apparatus. In accordance with alternative examples of the disclosure, the plasma power provided during one or more steps (e.g., the first treatment step and the second treatment step) can be formed using a surface wave plasma (SWP) apparatus, an inductively coupled plasma (ICP) apparatus, or an electron cyclotron resonance (ECR) apparatus.

Reactor system 800 includes a pair of electrically conductive flat-plate electrodes 814, 818 typically in parallel and facing each other in an interior 801 (reaction zone) of a reaction chamber 802. Although illustrated with one reaction chamber 802, reactor system 800 can include two or more reaction chambers. A plasma can be excited within interior 801 by applying, for example, RF power from plasma power source(s) 808 to one electrode (e.g., electrode 818) and electrically grounding the other electrode (e.g., electrode 814). A temperature regulator 803 (e.g., to provide heat and/or cooling) can be provided in a lower stage 814 (the lower electrode), and a temperature of a substrate 822 placed thereon can be kept at a desired temperature, such as the temperatures noted above. Electrode 818 can serve as a gas distribution device, such as a shower plate or showerhead. Precursor gases, reactant gases, and a carrier or inert gas, if any, or the like can be introduced into reaction chamber 802 using one or more gas lines (e.g., reactant gas line 804 and precursor gas line 806, respectively, coupled to a reactant source 807 and a precursor (e.g., silicon) source 805). For example, an inert gas and a reactant (e.g., as described above) can be introduced into reaction chamber 802 using line 804 and/or a precursor and a carrier gas (e.g., as described above) can be introduced into the reaction chamber using line 806. Although illustrated with two inlet gas lines 804, 806, reactor system 800 can include any suitable number of gas lines.

In reaction chamber 802, a circular duct 820 with an exhaust line 821 can be provided, through which gas in the interior 801 of the reaction chamber 802 can be exhausted to an exhaust source 810. Additionally, a transfer chamber 823 can be provided with a seal gas line 829 to introduce seal gas into the interior 801 of reaction chamber 802 via the interior (transfer zone) of transfer chamber 823, wherein a separation plate 826 for separating the reaction zone and the transfer chamber 823 can be provided (a gate valve through which a substrate is transferred into or from transfer chamber 823 is omitted from this figure). Transfer chamber 823 can also be provided with an exhaust line 827 coupled to an exhaust source 810. In some embodiments, continuous flow of a carrier gas to reaction chamber 802 can be accomplished using a flow-pass system (FPS).

Reactor system 800 can include one or more controller(s) 812 programmed or otherwise configured to cause one or more method steps as described herein to be conducted. Controller(s) 812 are coupled with the various power sources, heating systems, pumps, robotics and gas flow controllers, or valves of the reactor, as will be appreciated by the skilled artisan. By way of example, controller 812 can be configured to control gas flow of a precursor, a reactant, and/or an inert gas into at least one of the one or more reaction chambers to form a treated silicon-carbon layer as described herein. Controller 812 can be further configured to provide power to form a plasma—e.g., within reaction chamber 802. Controller 812 can be similarly configured to perform additional steps as described herein.

Controller 812 can include electronic circuitry and software to selectively operate valves, manifolds, heaters, pumps and other components included in system 800. Such circuitry and components operate to introduce precursors, reactants, and purge gases from the respective sources. Controller 812 can control timing of gas pulse sequences, temperature of the substrate and/or reaction chamber, pressure within the reaction chamber, plasma power, and various other operations to provide proper operation of the system 800, such as in the performance of timing sequence 200 or 300.

Controller 812 can include control software to electrically or pneumatically control valves to control flow of precursors, reactants, and/or purge gases into and out of the reaction chamber 802. Controller 812 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 800, substrates, such as semiconductor wafers, are transferred from, e.g., a substrate handling area 823 to interior 801. Once substrate(s) are transferred to interior 801, one or more gases, such as precursors, reactants, carrier gases, and/or purge gases, are introduced into reaction chamber 802.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method of forming treated silicon-carbon material, the method comprising the steps of:

providing a substrate within a reaction chamber of a reactor;

depositing silicon-carbon material onto a surface of the substrate; and after the step of depositing, treating the silicon-carbon material, wherein the treating comprises:

a first treatment step followed by a second treatment step, wherein the first treatment step comprises providing first reductant gas activated species; and wherein the second treatment step comprises providing one or more of a first oxidant gas activated species and a second reductant gas activated species.

2. The method according to claim 1, wherein the first treatment step further comprises providing a second oxidant gas activated species.

3. The method according to claim 2, wherein the second treatment step comprises providing the second reductant gas activated species.

4. The method according to claim 1, wherein the second treatment step comprises providing the first oxidant gas activated species and the second reductant gas activated species.

5. The method according to claim 1, wherein the first reductant gas activated species and the second reductant gas activated species are formed using the same reductant gas.

6. The method according to claim 1, further comprising a step of purging after the first treatment step and before the second treatment step.

7. The method according to claim 1, further comprising repeating the steps of depositing silicon-carbon material and treating the silicon-carbon material.

8. The method according to claim 1, wherein the step of providing the first reductant gas activated species comprises providing a first reductant gas selected from the group consisting of Ar, He, $NH_3$, $N_2$ and $H_2$, and any combination thereof.

9. The method according to claim 1, wherein the step of providing the second reductant gas activated species comprises providing a second reductant gas selected from the group consisting of Ar, He, $NH_3$, $N_2$ and $H_2$, and any combination thereof.

10. The method according to claim 1, wherein the step of providing the first oxidant gas activated species comprises providing a first oxidant gas selected from the group consisting of CO, $CO_2$, $H_2O$, and a C1-C22 alcohol.

11. The method according to claim 1, wherein the step of providing the first oxidant gas activated species does not comprise providing oxygen ($O_2$) to the reaction chamber.

12. The method according to claim 1, wherein a temperature within the reaction chamber during the step of treating the silicon-carbon material is less than 400° C. or between about 50° C. and about 100° C.

13. The method according to claim 1, wherein a plasma power is pulsed during one or more of the first treatment step and the second treatment step.

14. The method according to claim 1, wherein a plasma power applied during one or more the first treatment step and the second treatment step is less than or equal to 2000 W or between about 400 W and about 600 W.

15. The method according to claim 1, wherein a frequency of a plasma power applied during one or more of the first treatment step and the second treatment step is no less than 100 kHz and no greater than 60 MHz.

16. The method according to claim 1, wherein a plasma power provided during one or more of the first treatment step and the second treatment step comprises a first frequency and a second frequency different from the first frequency.

17. The method according to claim 16, wherein the first frequency is no less than 15.56 MHz and no more than 60 MHz and wherein the second frequency is no less than 100 kHz and no more than 13.56 MHz.

18. The method according to claim 1, wherein the step of depositing silicon-carbon material onto a surface of the substrate comprises providing a precursor having a formula $Si_aC_bH_cO_dN_e$, where a is a natural number no less than 1 and no greater than 5, b is a natural number no less than 1 and no greater than 20, c is a natural number no less than 1 and no greater than 40, d is 0 or a natural number no greater than 10, and e is 0 or a natural number no greater than 5.

19. The method according to claim 1, wherein a plasma power provided during one or more the first treatment step and the second treatment step is formed using a capacitively coupled plasma (CCP) apparatus, a surface wave plasma (SWP) apparatus, an inductively coupled plasma (ICP) apparatus, or an electron cyclotron resonance (ECR) apparatus.

20. A method of filling a gap on a surface of a substrate according to a method of claim 1.

* * * * *